United States Patent
Kato et al.

(10) Patent No.: US 10,366,486 B2
(45) Date of Patent: Jul. 30, 2019

(54) IMAGE PROCESSING DEVICE, MOUNTING PROCESSING SYSTEM, IMAGE PROCESSING METHOD AND PROGRAM

(71) Applicant: FUJI CORPORATION, Chiryu-shi (JP)

(72) Inventors: Takeshi Kato, Toyota (JP); Hiroshi Oike, Chiryu (JP); Hirotake Esaki, Ichinomiya (JP)

(73) Assignee: FUJI CORPORATION, Chiryu-shi (JP)

( * ) Notice: Subject to any disclaimer, the term of this patent is extended or adjusted under 35 U.S.C. 154(b) by 38 days.

(21) Appl. No.: 15/542,789

(22) PCT Filed: Feb. 4, 2015

(86) PCT No.: PCT/JP2015/053047
§ 371 (c)(1),
(2) Date: Jul. 11, 2017

(87) PCT Pub. No.: WO2016/125262
PCT Pub. Date: Aug. 11, 2016

(65) Prior Publication Data
US 2018/0012351 A1    Jan. 11, 2018

(51) Int. Cl.
*G06K 9/00* (2006.01)
*G06T 7/00* (2017.01)
(Continued)

(52) U.S. Cl.
CPC ....... *G06T 7/0008* (2013.01); *H04N 5/44504* (2013.01); *H05K 13/04* (2013.01);
(Continued)

(58) Field of Classification Search
CPC ............... A47C 20/041; A47C 31/008; A61G 2203/16; A61G 7/015; A61G 7/018
(Continued)

(56) References Cited

U.S. PATENT DOCUMENTS 6,477,266 B1 * 11/2002 Asar ................ G01N 21/95607
382/144
6,701,003 B1 * 3/2004 Feinstein ........... G06K 9/00476
382/147
(Continued)

FOREIGN PATENT DOCUMENTS

EP         1 424 885 A2    6/2004
JP       2004-165456 A     6/2004
(Continued)

OTHER PUBLICATIONS

Extended European Search Report dated Feb. 9, 2018 in Patent Application No. 15881079.6, 10 pages.
International Search Report dated Apr. 7, 2015 in PCT/JP2015/053047 filed Feb. 4, 2015.

*Primary Examiner* — Charlotte M Baker
(74) *Attorney, Agent, or Firm* — Oblon, McClelland, Maier & Neustadt, L.L.P.

(57) ABSTRACT

A mounting device mounts components on a board, and performs processing of arranging discard components discarded based on a captured image on a discard loading section. A CPU of a management computer acquires an identification image in which it is possible to identify a discard component to be discarded and a captured image of the discard component, links the acquired identification image of the discard component and the captured image of the discard component, and creates a discard component arrangement image screen that includes an arrangement display area in which the identification images are arranged based on an order in which the discard components were arranged on discard loading section. The CPU of management computer then outputs the created discard component arrangement image screen.

17 Claims, 6 Drawing Sheets

(51) Int. Cl.
  *H05K 13/08* (2006.01)
  *H04N 5/445* (2011.01)
  *H05K 13/04* (2006.01)
  *G06F 3/0481* (2013.01)
  *G06F 3/0484* (2013.01)

(52) U.S. Cl.
  CPC ......... *H05K 13/08* (2013.01); *H05K 13/0813* (2018.08); *G06F 3/04817* (2013.01); *G06F 3/04842* (2013.01); *G06T 2200/24* (2013.01); *G06T 2207/30141* (2013.01)

(58) Field of Classification Search
  USPC ............... 382/147, 144, 199, 305, 141, 145; 702/108, 90; 714/42, 799
  See application file for complete search history.

(56) References Cited

U.S. PATENT DOCUMENTS

| | | |
|---|---|---|
| 2005/0071997 A1 | 4/2005 | Oyama et al. |
| 2005/0205642 A1* | 9/2005 | Kim ............... B23K 1/0016 228/8 |
| 2008/0313890 A1 | 12/2008 | Kino et al. |

FOREIGN PATENT DOCUMENTS

| | | |
|---|---|---|
| JP | 2009-4468 A | 1/2009 |
| JP | 2009-200143 A | 9/2009 |
| JP | 2014-110335 A | 6/2014 |
| JP | 2014-120654 A | 6/2014 |

* cited by examiner

IMAGE PROCESSING DEVICE, MOUNTING PROCESSING SYSTEM, IMAGE PROCESSING METHOD AND PROGRAM

TECHNICAL FIELD

The present application relates to an image processing device, a mounting processing system, and an image processing method, in particular to an image processing device, a mounting processing system, and an image processing method related to processing of mounting components on a board.

BACKGROUND ART

Conventionally, there are known mounting devices (for example, refer to patent literature 1) provided with a conveyor that conveys components determined to be defective, wherein the mounting device is able to know the whereabouts, within a specified component loading region on the conveyor, of an empty region on which no components are loaded, and loads defective components in the empty region considering the direction ad arrangement position of the defective components.

CITATION LIST

Patent Literature

Patent Literature 1
JP-A-2004-165456

SUMMARY

However, with the above mounting device, for example, an operator may want to know the relationship between a cause of the component being determined defective and a state of the component. In a mounting system, details of a defective determination of a defective component are sometimes memorized in a management server or the like, but there is a problem in that it is not known which information corresponds to a component loaded on the conveyor.

The present disclosure takes account of such problems and a main object thereof is to provide an image processing device, and an image processing method and program that allows an operator to more easily identify a discarded component.

The present disclosure uses the following device to achieve the above object.

The present disclosure of an image processing device is for use in a mounting device, which mounts components on a board, provided with a discard processing section that arranges a discard component to be discarded based on a captured image to a specified discard loading section, with the image processing device including:
an information acquiring section configured to acquire an identification image in which it is possible to identify the discard component to be discarded by the discard processing section and a captured image of the discard component;
a screen creating section configured to link the identification image of the discard component and the captured image of the discard component acquired by the information acquiring section and to create a discard component arrangement image screen that includes an arrangement display area in which the identification images are arranged based on an order in which the discard processing section loaded the discard components on the discard loading section; and
an output section configured to output the discard component arrangement image screen created by the screen creating section.

With this image processing device, first, the mounting device mounts components on a board, and performs processing of arranging discard components discarded based on a captured image on the specified discard loading section. The device acquires an identification image in which it is possible to identify the discard component to be discarded and a captured image of the discard component. Next, the device links the acquired identification image of the discard component and the captured image of the discard component and creates a discard component arrangement image screen that includes an arrangement display area in which the identification images are arranged based on an order in which the discard components were arranged on the discard loading section. Continuing, the device outputs the created discard component arrangement image screen. Then, an operator is able to check discard components loaded on the discard loading section and check the arrangement of the discard components of the arrangement display area of the outputted discard component arrangement image screen. Thus, with the device, an operator can more easily identify a discard component.

With the present disclosure of an image processing device, the screen creating section may create the discard component arrangement image screen including a captured image display area in which is displayed the identification image arranged in the arrangement display area and the captured image corresponding to the identification image, or in which is displayed the captured image corresponding to a selected identification image when an identification image arranged in the arrangement display area is selected. With this device, it is easy for an operator to check captured images using the captured image display area.

With the present disclosure of an image processing device, the information acquiring section may also be configured to acquire discard information related to a discard reason of the discard components, and the screen creating section may be configured to create the discard component arrangement image screen including a discard information display area in which is displayed the identification image arranged in the arrangement display area and the discard information of the discard component corresponding to the identification image, or in which is displayed the discard information of the discard component corresponding to a selected identification image when an identification image arranged in the arrangement display area is selected. With this device, it is easy for an operator to check discard reasons of discard components using the discard information display area.

With the present disclosure of an image processing device, the screen creating section may be configured to use at least one of an icon image that represents the discard component or a thumbnail image that is a compressed version of the captured image of the discard component as the identification image. With this device, an operator can more easily identify a discard component using the icon image or the thumbnail image.

With the present disclosure of an image processing device, the discard loading section may be a discard conveyor, and the screen creating section may be configured to create the discard component arrangement image screen including the arrangement display area that represents the discard component arranged on the discard conveyor.

With the present disclosure of an image processing device, the screen creating section may be configured to create the discard component arrangement image screen with the identification image of the discard component that has been removed from discard loading section deleted from the arrangement display area, based on a detection result from a detection section, which is provided on the mounting device, configured to detect the discard component on the discard loading section. With this device, it is possible to appropriately update the arrangement display area based on detection results of discard components. In this case, the screen creating section may be configured to create the discard component arrangement image screen with the identification image of the discard component that has been removed from discard loading section deleted from the arrangement display area, after the discard components have been arranged on the entire discard loading section.

The present disclosure of a mounting processing system includes: a mounting device configured to mount components on a board and provided with a discard processing section configured to arrange a discard component to be discarded based on a captured image to a specified discard loading section; and an image processing device according to any one of the above.

Because this mounting processing system is provided with one of the above image processing devices, an operator can more easily identify a discard component. Also, the mounting processing system is able to achieve the effects of the employed image processing device.

The present disclosure of an image processing method is for use in a mounting device, which mounts components on a board, provided with a discard processing section that arranges a discard component to be discarded based on a captured image to a specified discard loading section, the image processing method including:
(a) an acquiring step of acquiring an identification image in which it is possible to identify the discard component to be discarded by the discard processing section and a captured image of the discard component;
(b) a creating step of linking the identification image of the discard component and the captured image of the discard component acquired in step (a) and creating a discard component arrangement image screen that includes an arrangement display area in which the identification images are arranged based on an order in which the discard processing section loaded the discard components on the discard loading section; and
(c) an outputting step of outputting the discard component arrangement image screen created in step (b).

With the above image processing method, similar to with the above image processing device, an operator is able to check discard components loaded on the discard loading section and check the arrangement of the discard components of the arrangement display area of the outputted discard component arrangement image screen. Thus, with the method, an operator can more easily identify a discard component. Note that, with this image processing method, various forms of the above image processing device may be employed, and steps to perform each function of the above image processing device may be added.

The present disclosure of a program is a program of a computer that performs at least one of the above steps of the image processing method. This program may be memorized on a storage medium that can be read by a computer (for example, hard disk, ROM, FD, CD, DVD), or may be sent from the computer to another computer via a transmission medium (such as a communication network such as the internet or LAN), or may be received by any other way. Regardless of whether a single computer performs the program or whether each steps is divided across multiple computers, because each step of the method image processing method is performed, the same effects as the method are achieved.

DESCRIPTION OF EMBODIMENTS

Figure 1:
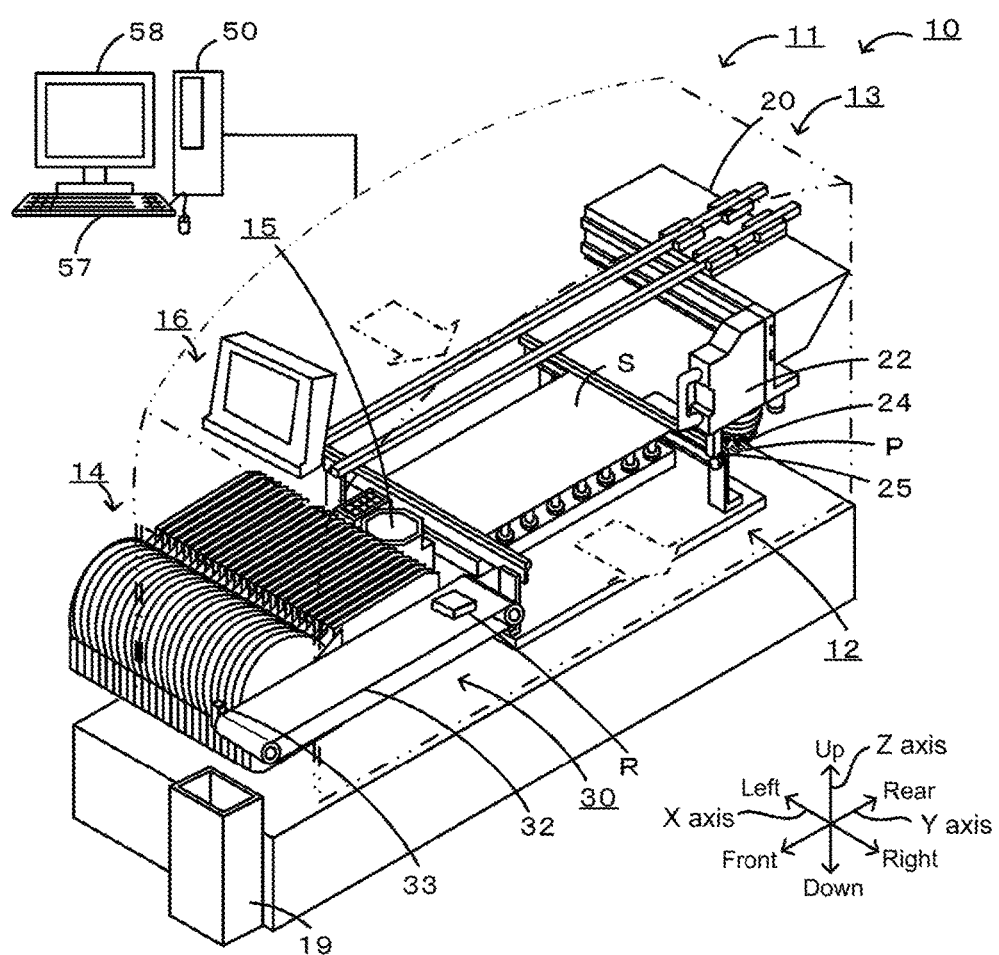
FIG. 1 is a schematic view showing an example of mounting system 10.
Figure 2:
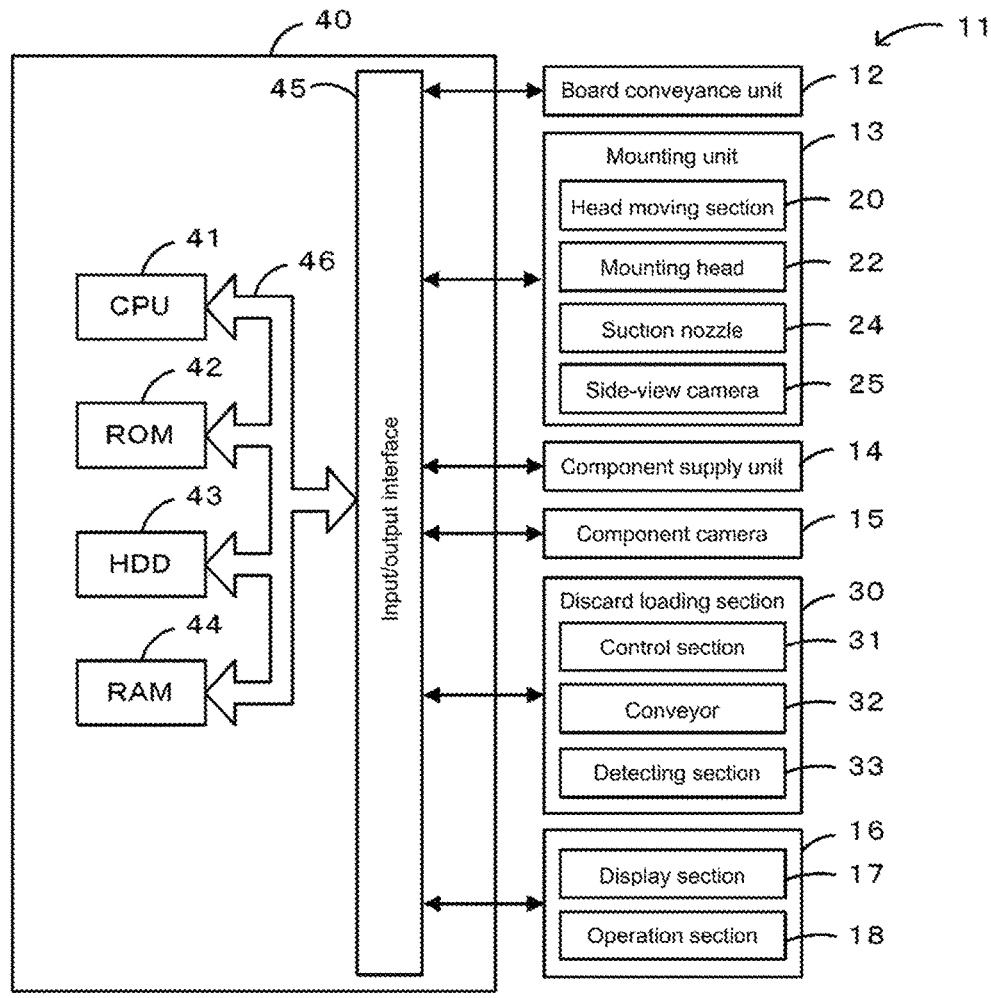
FIG. 2 is a block diagram showing the configuration of mounting device 11 and management computer 50.

Hereinafter, an embodiment of the present disclosure will be described with reference to the figures. FIG. 1 is a schematic viewing showing an example of mounting system 10. FIG. 2 is a block diagram showing the configuration of mounting device 11 and management computer 50. Mounting system 10 mounts components P on board S. Mounting system 10 is provided with mounting device 11 and management computer 50. Multiple mounting devices 11 that perform mounting processing of mounting components P on board S are arranged from upstream to downstream in mounting system 10. For ease of understanding, FIG. 1 only shows one mounting device 11. In the present embodiment, left-right directions (X axis), front-rear directions (Y axis), and up-down directions (Z axis) are set as shown in FIG. 1.

As shown in FIGS. 1 and 2, mounting device 11 is provided with board conveyance unit 12, mounting unit 13, component supply unit 14, component camera 15, operation panel 16, discard loading section 30, and control device 40. Board conveyance unit 12 loads board S, conveys board S, fixes board S at a mounting position, and unloads board S. Board conveyance unit 12 includes a pair of conveyor belts provided extending in a left-right direction and separated in the front-rear direction of FIG. 1. Board S is conveyed by these conveyor belts.

Mounting unit 13 picks up component P from component supply unit 14 and mounts the component P on board S fixed by board conveyance unit 12. Mounting unit 13 is provided with head moving section 20, mounting head 22, suction nozzle 24, and side-view camera 25. Head moving section 20 is provided with sliders that move in XY directions guided by guide rails and motors that drive the sliders. Mounting head 22 is removably attached to a slider and is movable in the XY directions by head moving section 20. At least one suction nozzle 24 is removably attached to an underside of mounting head 22. Mounting head 22 is equipped with a Z-axis motor and the height of suction nozzle 24 is adjusted along the Z-axis by the Z-axis motor. Suction nozzle 24 is for picking up component P, is supplied with negative pressure via a pressure reducing pump, which is not shown, and picks up component P using the negative pressure. Side-view camera 25 is for imaging from the side suction nozzle 24 that is holding a component P.

Component supply unit 14 is provided with multiple reels, and is removably attached to a front side of mounting device 11. Tape is wound on each reel and components P are held in the surface of the tape in a lengthwise direction. The tape is unwound to the rear from the reel, and with a component P exposed, is fed by a feeder section to a pickup position at which the component P is picked up by suction nozzle 24.

Component camera 15 is for imaging component P held by mounting head 22, and is arranged between board conveyance unit 12 and component supply unit 14. The imaging range of component camera 15 is above component camera 15. Component camera 15 images component P held by suction nozzle 24 when suction nozzle 24 holding the component P passes above component camera 15, and outputs the imaging result to control device 40.

Operation panel 16 is provided with display section 17 and operation section 18. Display section 17 is configured as a display for notifying information to an operator by displaying various information. Operation section 18 is provided with a touch screen or entry keys for an operator to enter various commands.

Discard loading section 30 is for loading discard components R that are to be discarded. As shown in FIG. 2, discard loading section 30 is provided with control section 31, conveyor 32, and detecting section 33. Control section 31 controls conveyor 32 and acquires detection signals from detecting section 33. Conveyor 32 is loaded with discard components R and moves the loaded components R in a front-rear direction. Waste box 19 is located under the front end of conveyor 32 (refer to FIG. 1). Detecting section 33 is a non-contact sensor that outputs a detection signal if an object is present within a detecting region. Discard loading section 30, when a new discard component R is to be loaded by mounting unit 13, feeds already loaded discard components R forwards such that the new discard component R is loaded in an empty space.

As shown in FIG. 2, control device 40 is configured from a microprocessor based around CPU 41, ROM 42 that memorizes a processing program, HDD 43 that memorizes various data, RAM 44 used as working memory, input/output interface 45 for performing communication of electric signals with external devices, and so on, and these are connected by bus 46. Control device 40 inputs and outputs control signals between board conveyance unit 12, mounting unit 13, component supply unit 14, component camera 15, operation panel 16, and discard loading section 30, and receives image data from side-view camera 25 and component camera 15.

Management computer 50 manages information of each device of mounting system 10. Management computer 50 is configured from items including CPU 51, ROM 52 that memorizes a processing program, HDD 53 that memorizes various information, RAM 54 used as working memory, input/output interface 55 for performing communication of electric signals with external devices, and these are connected by bus 56. Management computer 50 is provided with input device 57 such as a keyboard and mouse for an operator to input various commands, and display 58 for displaying various information. Mounting job information, a component database, data of images captured of discard components, and so on are memorized in HDD 53. Mounting job information includes information such as the type (identification information) of components P to be mounted by mounting device 11, the mounting location, and the mounting order. The component database includes information such as identification information, size information, reference images used as a shape reference, and identification images of components P. An identification image may be an icon image created to represent component P, that is, image data from which it is possible to identify the shape of component P, or a thumbnail image that is a compressed version of an image of component P. Captured image data of discard component R is captured during mounting processing of mounting device 11 by component camera 15 or side-view camera 25, and is acquired from mounting device 11 and memorized in HDD 53 when that component P is determined to be discarded. The captured image data is saved in HDD 53 linked to identification information of discard component R and information of a discard reason determined at mounting device 11 such that an operator can check later. In this manner, management computer 50 has a function to acquire an identification image in which it is possible to identify discard component R that is discarded and a captured image of the discard component R. Also, management computer 50 has a function to link the acquired identification image of the discard component and the captured image of the discard component and create a discard component arrangement image screen that includes an arrangement display area in which the identification images are arranged based on an order in which the discard components were arranged on discard loading section 30. Further, management computer 50 has a function to output the created discard component arrangement image screen to display 58 or display section 17.

Next, operation of mounting system 10 of the present embodiment as configured above is described, with the mounting processing of mounting device 11 being described first. When mounting processing is started, CPU 41 of control device 40 controls mounting unit 13 such that suction nozzle 24 suitable for the component P to be picked up is attached to mounting head 22 and then picks up component P from component supply unit 14. Next, CPU 41 causes side-view camera 25 to image component P from the side. Further, CPU 41 controls head moving section 20 such that mounting head 22 moves above component camera 15, and images the component P held by mounting head 22 using component camera 15. Continuing, CPU 41 detects the shape, position, rotation angle and so on of component P based on the imaging results of component camera 15 and side-view camera 25. CPU 41 performs pattern matching between the reference image and the captured image of component P and determines the rotation angle of component P and whether there are any problems with the shape. Then, CPU 41 adjusts the position and rotation angle of component P and arranges component P on board S. Here, if there is a problem with the shape of component P such as a deformation, a pickup position deviation so large that arrangement is not possible, or other such problem, CPU 41 causes mounting unit 13 to perform discard processing without mounting the component P. CPU 41 repeats such processing based on the mounting job information until arrangement of all the components P on board S is complete.

Figure 3:
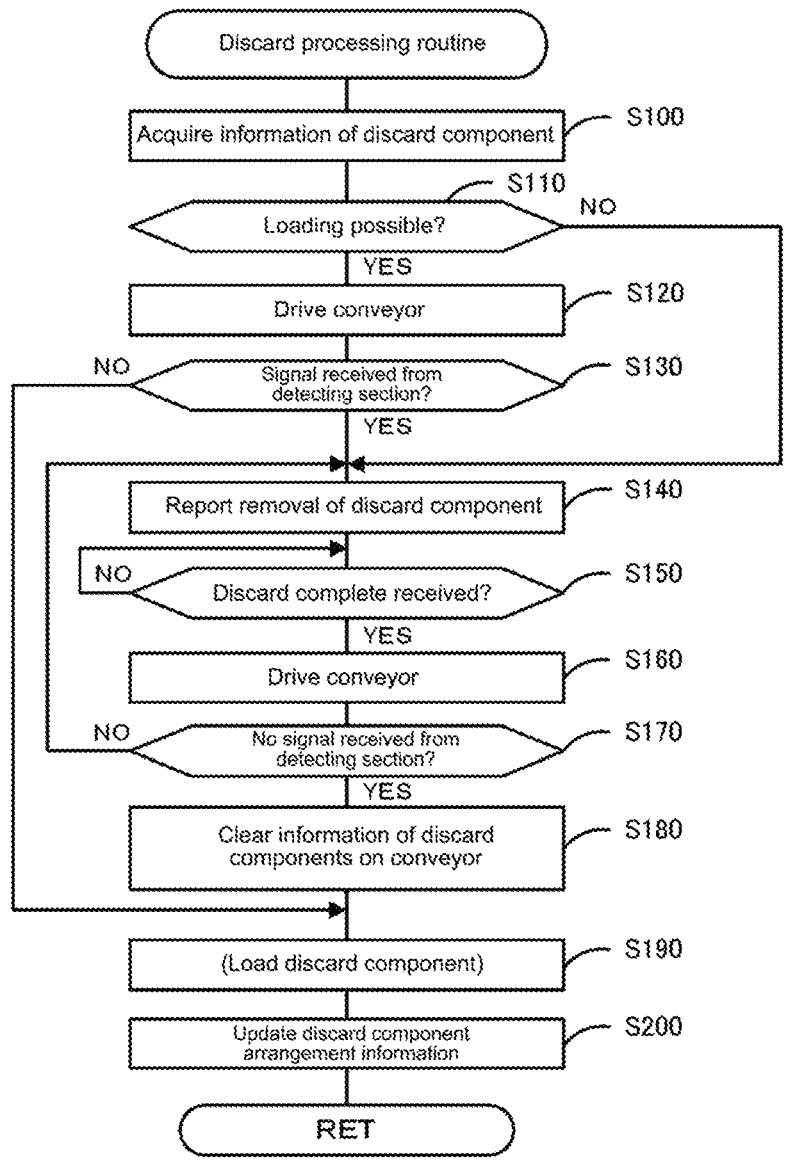
FIG. 3 is a flowchart showing an example of a discard processing routine.

Discard processing at discard loading section 30 will be described next. FIG. 3 is a flowchart showing an example of a discard processing routine performed by control section 31 of discard loading section 30. This routine is performed by control section 31 whenever control device 40 determines that a component P is to be discarded. When this routine is started, control section 31 acquires information of discard component R from control device 40 (step S100). Information of discard component R acquired by control section 31 includes, for example, the size of discard component R. Next, control section 31 determines whether there is space for the discard component R being held by mounting head 22 to be loaded on conveyor 32 based on the acquired information of discard component R and the current state of conveyor 32 (step S110). Note that, control section 31 links information such as identification information, size, and position of discard component R loaded on conveyor 32 and information of a captured image linked to the identification information of the discard component R, and manages this as discard component arrangement information.

Figure 4:
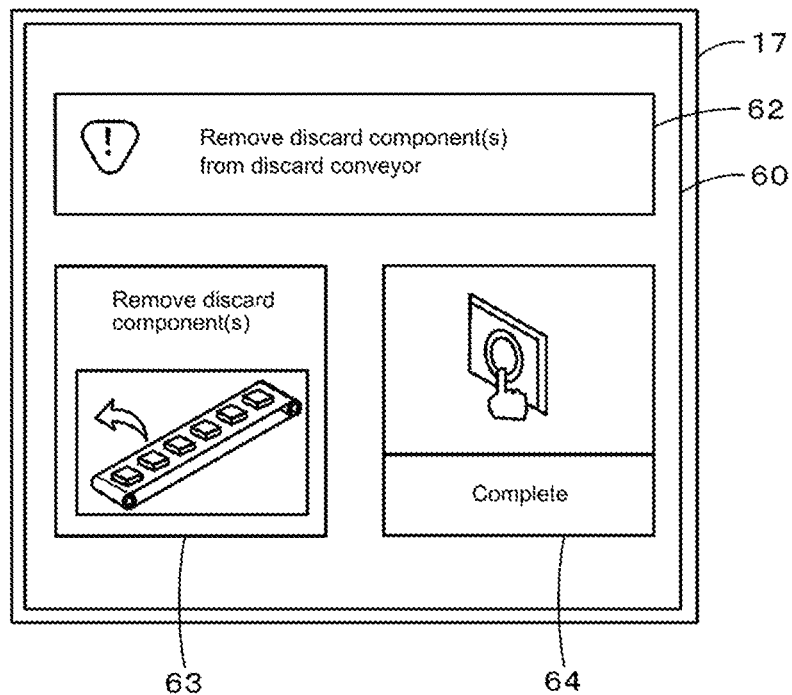
FIG. 4 illustrates an example of discard component removal notification screen 60.

If it is possible to load discard component R being held by mounting head 22 on conveyor 32, control section 31 moves conveyor 32 forwards by an amount corresponding to the size of discard component R (step S120), and then, as a check, determines whether a detection signal is received from detecting section 33 (step S130). If a detection signal is received from detecting section 33, control section 31 determines that a discard component R has arrived at the frontmost section of conveyor 32, and outputs a command to control device 40 to display on display panel 16 a notification screen indicating that discard components R should be removed from conveyor 32 (step S140). Having received this command, control device 40 displays the notification screen of display section 17. FIG. 4 illustrates an example of discard component removal notification screen 60. Message display area 62, indication display area 63, and complete entry display area 64 are arranged on discard component removal notification screen 60. A message explaining that discard components R should be removed from conveyor 32 is displayed in message display area 62. A screen showing removal processing of discard components R on conveyor 32 is displayed in indicating display area 63. An image indicating how to enter completion of discarding with respect to operation section 18 is displayed in complete entry display area 64. Also, control section 31 performs processing of step S140 also in a case in which it is determined in step S110 that a discard component R cannot be loaded on conveyor 32. An operator checks discard component removal notification screen 60, removes discard components R from discard loading section 30, and performs discard completion entry at operation section 18.

Next, control section 31 determines whether discard completion entry has been performed at operation section 18 based on a signal from control device 40 (step S150), and if discard completion entry has not been performed, stands by. On the other hand, if discard complete entry has been performed, control section 31 drives conveyor 32 continuously across a specified distance of the entire region in which discard components R can be loaded (step S160), and then determines whether there is a detection signal from detecting section 33 (step S170). If there is a detection signal from detecting section 33, control section 31 determines that there is a discard component R remaining on conveyor 32 and performs processing of step 140 and on. That is, control section 31 reports the need for removal of discard components to an operator. On the other hand, if there is no detection signal in step S170, control section 31 determines that all discard components R have been removed from conveyor 32, and clears information of discard components R that were arranged on conveyor R from the discard component arrangement information (step S180). In this manner, control section 31 updates the discard component arrangement information based on a detection signal from detecting section 33.

After step S180, or when there is no detection signal from detecting section 33 in step S130, control section 31 outputs a signal to control device 40, loads discard component R on conveyor 32 (step S190), adds the information of the loaded discard component R to update the discard component arrangement information (step S200), and ends the routine. In this manner, control section 31, based on a detection signal from detecting section 33, performs driving of conveyor 32 while updating discard component arrangement information that includes a state of discard component R loaded on conveyor 32.

Figure 5:
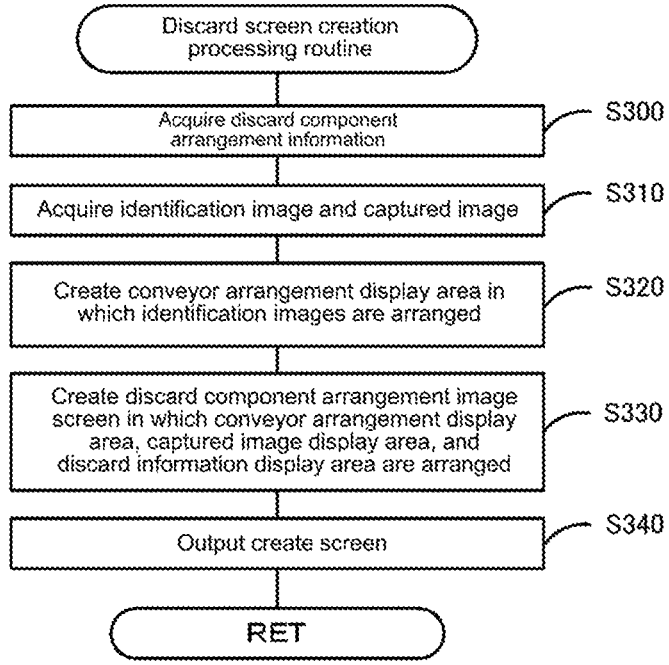
FIG. 5 is a flowchart showing an example of a discard screen creation processing routine.

With regard to discard loading section 30, described next is processing of creating a screen displayed on display section 17 or display 58. Here, management computer 50 is described as creating a screen with regard to discard loading section 30. FIG. 5 is a flowchart showing an example of a discard screen creation processing routine performed by CPU 51 of management computer 50. This routine is memorized on HDD 53, and is performed by CPU 51 based on entry of a display instruction from an operator. Here, descriptions are given in a case in which an operator operates operation panel 16 of mounting device 11 to display a screen on display section 17. When this routine is started, CPU 51 acquires discard component arrangement information from mounting device 11 (step S300), and acquires identification images corresponding to the discard components R loaded on conveyor 32 and captured image data captured at the time of discard (step S310). CPU 51 acquires captured image data from HDD 53 and the identification images from the component database. Next, CPU 51 creates a conveyor arrangement display area in which are arranged identification images (step S320), and creates a discard component arrangement image screen in which are arranged the conveyor arrangement display area, the captured image display area, and the discard information display area (step S330).

Figure 6:
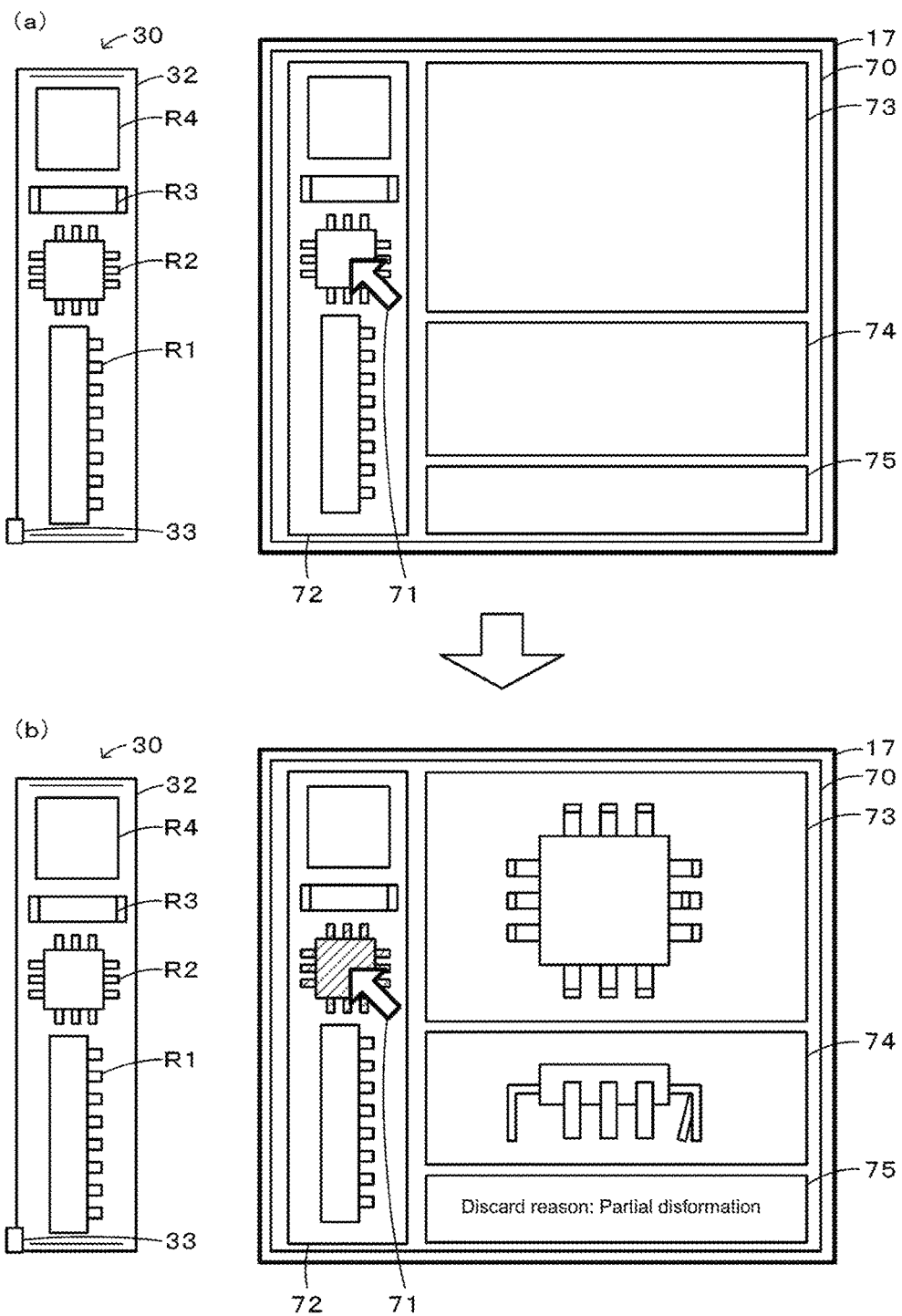
FIGS. 6A and 6B illustrate examples of discard component arrangement image screen 70.

FIG. 6 illustrates an example of discard component arrangement image screen 70, with FIG. 6A showing a state before selection of a discard component R, and FIG. 6B showing a state after selection of a discard component R. Included in discard component arrangement image screen 70 are cursor 71, conveyor arrangement display area 72, plan view captured image display area 73, side view captured image display area 74, and discard information display area 75. Cursor 71 is for selecting an image, and is movable up, down, left, and right according to entry by an operator. Conveyor arrangement display area 72 displays an image screen of identification images in the order of arrangement on discard loading section 30 by mounting unit 13. Identification images in the same arrangement order as discard components currently loaded on discard loading section 30 are arranged in conveyor arrangement display area 72 (see FIG. 6[a]). Plan view captured image display area 73 displays captured images of discard component R captured by component camera 15. Side view captured image display area 74 displays captured images of discard component R captured by side-view camera 25. Discard information display area 75 displays a discard reason for discard component R. With discard component arrangement image screen 70, captured images and a discard reason of a discard component R selected in conveyor arrangement display area 72 are displayed in plan view captured image display area 73, side view captured image display area 74, discard information display area 75, and conveyor arrangement display area 72 (see FIG. 6[b]). Note that, in discard component arrangement image screen 70, identification images of discard components R determined to have been removed from discard loading section 30 based on the detection result from detecting section 33 after discard components R are arranged on the entire discard loading section 30 are deleted from conveyor arrangement display area 72.

When discard component arrangement image screen 70 is created, CPU 51 outputs the created screen to mounting device 11 (step S340) and ends the routine. CPU 41 of mounting device 11 that has acquired discard component arrangement image screen 70 displays discard component arrangement image screen 70 on display section 17. Note that, detailed descriptions are omitted, but CPU 41, when an operator operates cursor 71 at discard component arrangement image screen 70 and selects one of the discard components R at conveyor arrangement display area 72, performs control to display the identification images and discard reason linked to that discard component R.

Discard component R is discarded for discard reasons such as component deformation, a problem with the pickup position, or an image processing error. When an operator wishes to know for what reason a discard component R was discarded, they cannot find out the determination result made at mounting device 11 just by checking the discard component R arranged on conveyor 32. For this, at discard component arrangement image screen 70, because an image of the discard component R loaded on conveyor 32, captured images of that components, and the discard reason are displayed, it is easy for an operator to check which discard component R is actually loaded on conveyor 32, and the discard reason. Therefore, an operator is able to determine whether the discard reason is proper, and can reuse the discard component R.

Correspondences between constituent elements of the present embodiment and constituent elements of the disclosure will be clarified here. CPU 51 of the present embodiment corresponds to an information acquiring section, screen creating section, and outputting section of the present disclosure; mounting unit 13 corresponds to a discard processing section; and discard loading section 30 corresponds to a discard loading section. Also, discard component arrangement image screen 70 corresponds to a discard component arrangement image screen; conveyor arrangement display area 72 corresponds to an arrangement display section; plan view captured image display area 73 and side view captured image display area 74 correspond to a captured image display area; and discard information display area 75 corresponds to a discard information display area. Note that, an example of an image processing method of the present disclosure is clear from descriptions of operation of management computer 50 in the present embodiment.

With the above described mounting system 10, first, mounting device 11 mounts components P on board S, and performs processing of arranging discard components R discarded based on a captured image on discard loading section 30. Then, CPU 51 of management computer 50 acquires an identification image in which it is possible to identify discard component R that is discarded and a captured image of the discard component R. Next, CPU 51 links the acquired identification image of the discard component and the captured image of the discard component and creates discard component arrangement image screen 70 that includes arrangement display area 72 in which the identification images are arranged based on an order in which the discard components were arranged on discard loading section 30, and outputs the created discard component arrangement image screen to mounting device 11. Then, an operator is able to check discard components R loaded on discard loading section 30 and check the arrangement of the discard components R of conveyor arrangement display area 72 of the outputted discard component arrangement image screen 70. Thus, an operator can more easily identify a discard component R.

Also, when an identification image arranged in conveyor arrangement display area 72 is selected, CPU 51 creates a screen including plan view captured image display area 73 and side view captured image display area 74 that display captured images linked to the selected identification image. Therefore, an operator can easily check the discard component R and corresponding captured images from conveyor arrangement display area 72, plan view captured image display area 73, and side view captured image display area 74. Further, when an identification image arranged in conveyor arrangement display area 72 is selected, CPU 51 creates a screen including discard information display area 75 that displays discard information of discard component R linked to the selected identification image. Therefore, an operator can easily check the discard component R and the corresponding discard reason from conveyor arrangement display area 72 and discard information display area 75. Further, because CPU 51 uses an icon image or a thumbnail image is used as an identification image, an operator can more easily identify a discard component R from the icon image or thumbnail image. Also, because CPU 51 creates an image including conveyor arrangement display area 72 that represents discard components R arranged on conveyor 32, an operator can easily check discard components R visually. Further, because CPU 51 creates a screen with the identification images of discard components R that have been taken away from discard loading section 30 based on the detection result of detection result 33 deleted from conveyor arrangement display area 72, it is possible to update conveyor arrangement display area 72 more appropriately.

Meanwhile, it goes without saying that the disclosure is not limited to the above-mentioned embodiment and various embodiments may be applied within the technical scope of the disclosure.

For example, in the above embodiment, discard component arrangement image screen 70 is described as including plan view captured image display area 73, side view captured image display area 74, and discard information display area 75, but one or more of these may be omitted, or all may be omitted. Also, in a case in which one or more of plan view captured display area 73, side view captured image display area 74, and discard information display area 75 are omitted, the omitted display area may be displayed on a separate screen. For example, the discard component arrangement image screen may just include the conveyor arrangement display area and be able to link to corresponding identification information and captured image. Here, when an identification image is selected, a captured image display area and/or discard information display area corresponding to the selected identification image may be displayed on separate screens. In this manner too, an operator can more easily identify a discard component R from the discard component arrangement image screen.

Figure 7:
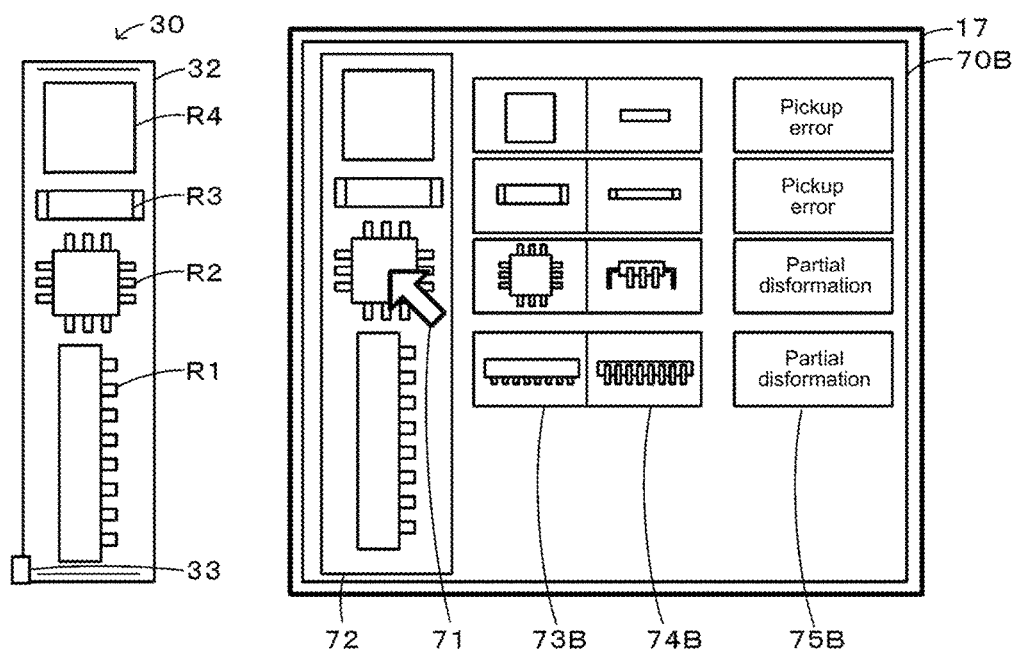
FIG. 7 illustrates an example of discard component arrangement image screen 70B.

In the above embodiment, captured images and discard information correspond to a discard component R are displayed after an identification image is selected, but the configuration is not limited to this. For example, as shown in FIG. 7, discard component arrangement image screen 70B, in which are arranged identification images and plan view captured image display area 73B and side view captured image display area 74B that display captured images, or identification images and discard information display area 75B that displays discard information, may be created. FIG. 7 illustrates an example of discard component arrangement image screen 70B. In this discard component arrangement image screen 70B, identification images are displayed with captured images and discard information. In this manner too, an operator can more easily identify a discard component R. Note that, in discard component arrangement image screen 70B, one or more of plan view captured image display area 73B, side view captured image display area 74B, and discard information display area 75B may be displayed after identification information is selected. Also, with discard component arrangement image screen 70B, for example, when a captured image display area is selected, captured images in this area may be displayed enlarged.

With the above embodiment, management computer 50 creates discard component arrangement image screen 70, and displays it on mounting device 11, but the configuration is not limited to this. For example, mounting device 11 may create discard component arrangement image screen 70, or discard component arrangement image screen 70 may be displayed on management computer 50. Note that, in a case in which mounting device 11 creates discard component arrangement image screen 70, mounting device 11 corresponds to an image processing device of the present disclosure.

In the above embodiment, discard loading section 30 is conveyor 32, but the configuration is not limited to this, for example, a loading table may be used.

In the above embodiment, discard loading section 30 updates the discard component arrangement information using a detection result of detecting section 33, but the configuration is not limited to this, and the discard component arrangement information may be updated without using a detection result of detecting section 33. Also, discard loading section 30 does not have to be provided with detecting section 33. For example, when a discard component R arises, control section 31 may drive conveyor 32 and consecutively discard discard component R from the tip of conveyor 32 to waste box 19, and update the discard component arrangement information accordingly. Further, in the above embodiment, in the discard processing routine, processing of steps S100 to S200 is performed, but, for example, a portion of this processing may be omitted, and only processing of steps S100, S120, S190, and S200 performed. In this manner too, an operator can more easily identify a discard component R from discard component arrangement image screen 70.

Although not described in the embodiments above, discard loading section 30 may be provided with operation keys to operate conveyor 32 manually. Here, control section 31 manages the position of conveyor 32, and when conveyor 32 is operated with a discard component R loaded, when the discard component moves outside the region of conveyor 32, the discard component R may be removed.

In the above embodiments the present disclosure is described as management computer 50 as an image processing device, but the configuration is not limited to this, and may be an image processing method, or a program.

INDUSTRIAL APPLICABILITY

The present disclosure may be used on a device that performs mounting related processing of arranging components on a board.

REFERENCE SIGNS LIST

10: mounting system; 11: mounting device; 12: board conveyance unit; 13: mounting unit; 14: component supply unit; 15: component camera; 16: operation panel; 17: display section; 18: operation section; 19: waste box; 20: head moving section; 22: mounting head; 24: suction nozzle; 25: side-view camera; 30: discard loading section; 31: control section; 32: conveyor; 33: detection section; 40: control device; 41: CPU; 42: ROM; 43: HDD; 44: RAM; 45: input/output interface; 46: bus; 50: management computer; 51: CPU; 52: ROM; 53: HDD; 54: RAM; 55: input/output interface; 56: bus; 57: input device; 58: display; 60: discard component removal notification screen; 62: message display area; 63: indication display area; 64: complete entry display area; 70, 70B: discard component arrangement image screen; 71: cursor; 72: conveyor arrangement display area; 73, 73B: plan view captured image display area; 74, 74B: side view captured image display area; 75, 75B: discard information display area; P: component; R: discard component; S: board

The invention claimed is:

1. An image processing device for use in a mounting device, which mounts components on a board, provided with a discard processing section that arranges a discard component to be discarded based on a captured image of the discard component to a discard loading section, the image processing device comprising:
    circuitry configured to:
    acquire an identification image in which it is possible to identify the discard component to be discarded by the discard processing section and the captured image of the discard component;
    link the identification image of the discard component and the captured image of the discard component;
    create a discard component arrangement image screen that includes an arrangement display area in which a plurality of the identification images are arranged based on an order in which the discard processing section loaded a corresponding plurality of the discard components on the discard loading section; and
    output the discard component arrangement image screen.

2. The image processing device according to claim 1, wherein the circuitry is configured to create the discard component arrangement image screen including a captured image display area in which a captured image corresponding to an identification image of the plurality of the identification images is displayed.

3. The image processing device according to claim 1, wherein the circuitry is configured to:
    acquire discard information related to a discard reason of the plurality of the discard components, and
    create the discard component arrangement image screen including a discard information display area in which the discard information of a discard component corresponding to an identification image of the plurality of the identification images is displayed.

4. The image processing device according to claim 1, wherein the circuitry is configured to use an icon image that represents the discard component as the identification image.

5. The image processing device according to claim 1, wherein
    the discard loading section is a discard conveyor, and
    the circuitry is configured to create the discard component arrangement image screen including the arrangement display area that represents the plurality of the discard components arranged on the discard conveyor.

6. The image processing device according to claim 1, wherein
    the circuitry is configured to remove an identification image of a discard component that has been removed from discard loading section from the arrangement display area, based on a detection result from a detection section, which is provided on the mounting device, configured to detect the discard component on the discard loading section.

7. A mounting processing system comprising:
the image processing device according to claim 1; and
the mounting device.

8. The image processing device according to claim 1, wherein the circuitry is configured to create the discard component arrangement image screen including a captured image display area in which a captured image corresponding to a selected identification image is displayed when an identification image of the plurality of the identification images arranged in the arrangement display area is selected.

9. The image processing device according to claim 8, wherein the circuitry is configured to:
acquire discard information related to a discard reason of the plurality of the discard components, and
create the discard component arrangement image screen including a discard information display area in which the discard information of a discard component corresponding to the selected identification image is displayed.

10. The image processing device according to claim 9, wherein the captured image display area includes:
a plan view captured image display area in which a captured image of a plan view of a discard component corresponding to the selected identification image is displayed; and
a side view captured image display area in which a captured image of a side view of the discard component corresponding to the selected identification image is displayed.

11. The image processing device according to claim 1, wherein the circuitry is configured to:
acquire discard information related to a discard reason of the plurality of the discard components, and
create the discard component arrangement image screen including a discard information display area in which the discard information of a discard component corresponding to a selected identification image is displayed when an identification image of the plurality of the identification images arranged in the arrangement display area is selected.

12. The image processing device according to claim 2, wherein the captured image display area includes:
a plan view captured image display area in which a captured image of a plan view of a discard component corresponding to a selected identification image is displayed when an identification image of the plurality of the identification images is selected; and
a side view captured image display area in which a captured image of a side view of the discard component corresponding to the selected identification image is displayed.

13. The image processing device according to claim 1, wherein the circuitry is configured to use a compressed version of the captured image of the discard component as the identification image.

14. The image processing device according to claim 1, wherein the circuitry is configured to acquire the identification image from a component database.

15. The image processing device according to claim 2, wherein the captured image display area includes:
a plan view captured image display area in which a captured image of a plan view of a discard component corresponding to an identification image of the plurality of the identification images is displayed; and
a side view captured image display area in which a captured image of a side view of the discard component corresponding to the identification image of the plurality of the identification images is displayed.

16. An image processing method for use in a mounting device, which mounts components on a board, provided with a discard processing section that arranges a discard component to be discarded based on a captured image of the discard component to a discard loading section, the image processing method comprising:
acquiring an identification image in which it is possible to identify the discard component to be discarded by the discard processing section and the captured image of the discard component;
linking the identification image of the discard component and the captured image of the discard component;
creating a discard component arrangement image screen that includes an arrangement display area in which a plurality of the identification images are arranged based on an order in which the discard processing section loaded a corresponding plurality of the discard components on the discard loading section; and
outputting the discard component arrangement image screen.

17. A non-transitory computer readable medium including computer executable instructions for executing the image processing method according to claim 16 when executed by one or more computers.

* * * * *